United States Patent [19]
Yen et al.

[11] Patent Number: 4,926,146
[45] Date of Patent: May 15, 1990

[54] PARALLEL-TO-SERIAL SIGNAL PROCESSOR USING SURFACE ACOUSTIC WAVES

[75] Inventors: Kuo-Hsuing Yen, Manhattan Beach; Reynold S. Kagiwada, Los Angeles; Robert B. Stokes, Torrance; Marshall Y. Huang, Rancho Palos Verdes, all of Calif.

[73] Assignee: TRW Inc., Redondo Beach, Calif.

[21] Appl. No.: 161,524

[22] Filed: May 9, 1988

[51] Int. Cl.$^5$ .............................. H03H 9/00
[52] U.S. Cl. ................... 333/195; 333/154; 333/193; 310/313 B; 310/313 R
[58] Field of Search ............ 333/193, 194, 195, 196, 333/154; 310/313 R, 313 A, 313 B, 313 C, 313 D; 324/77 B

[56] References Cited

U.S. PATENT DOCUMENTS

| | | | |
|---|---|---|---|
| 3,831,116 | 8/1974 | Davis, Jr. et al. | 333/193 |
| 3,898,592 | 8/1975 | Solie | 333/195 |
| 4,129,837 | 12/1978 | Hartemann | 333/196 X |
| 4,354,166 | 10/1982 | Grudkowski | 333/195 X |
| 4,499,393 | 2/1985 | Stokes et al. | 333/196 X |
| 4,611,140 | 9/1986 | Whitlock et al. | 310/313 B |
| 4,707,631 | 11/1987 | Stokes et al. | 310/313 A |
| 4,742,319 | 5/1988 | Sone | 333/194 X |

Primary Examiner—Eugene R. LaRoche
Assistant Examiner—Seung Ham
Attorney, Agent, or Firm—Noel F. Heal; Ronald L. Taylor

[57] ABSTRACT

A surface acoustic wave (SAW) device for converting multiple parallel signals to a smaller number of serial signals. The device includes a piezoelectric substrate and a surface acoustic wave (SAW) input transducer for propagating periodic surface acoustic waves across the substrate. The parallel signals are input to the device through an array of acoustic charge transport (ACT) input transducers, which convert the signals into packets of electrical charge that are transported across the device with the surface acoustic waves generated at the SAW input transducer. An ACT output transducer converts the charge packets back into electrical signals, but in serial rather than parallel form. The converter of the invention can be usefully combined with a SAW channelizer or spectrum analyzer, to provide serial outputs from the analyzer.

3 Claims, 2 Drawing Sheets

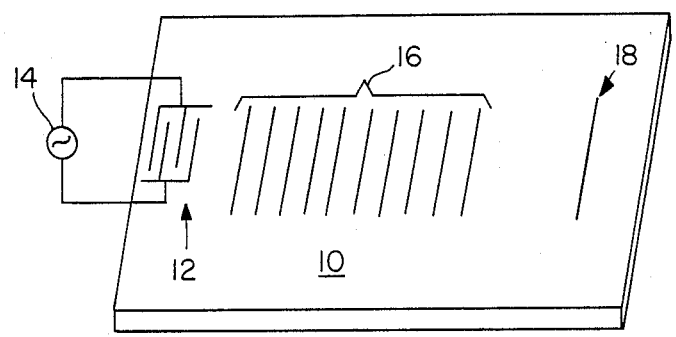
FIG. 1
FIG. 2
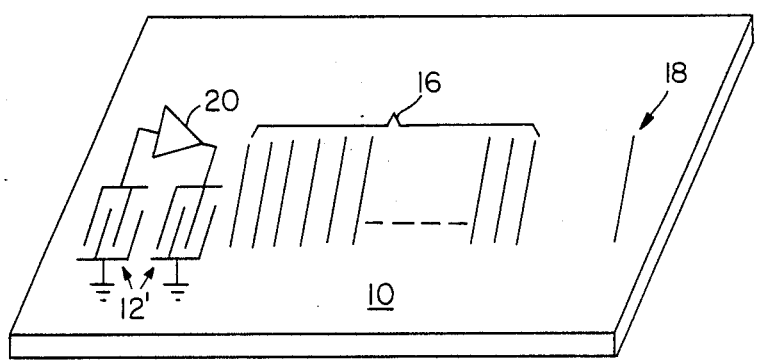

PARALLEL-TO-SERIAL SIGNAL PROCESSOR USING SURFACE ACOUSTIC WAVES

BACKGROUND OF THE INVENTION

This invention relates generally to surface acoustic wave (SAW) devices and, more specifically, to a need in SAW devices for processing large amounts of parallel information.

SAW devices employ substrates of a piezoelectric material, across which elastic surface waves are propagated between sets of electro-acoustic transducers disposed on the substrate surface. The surface waves, called Rayleigh waves, have an amplitude of displacement that is largest right at the substrate surface. In a piezoelectric material, deformations induced by the waves induce local electric fields, which are propagated with the acoustic waves and extend into space above the surface of the material. These electric fields will interact with electrodes disposed on the surface of the material, to serve as electrical input and output transducers for the surface acoustic wave device.

Although many SAW devices are basically serial in nature, and process signals from an input transducer to a single output transducer, there are other classes of SAW devices in which output information is generated in parallel, such as in spectrum analyzers, chirp analyzers, or acoustooptic Bragg cells. Because of the large number of simultaneous parallel outputs involved, these signals are very difficult to process and to extract useful information from.

It will be appreciated from this brief explanation that there is a need for a SAW device that can convert many parallel channels into a serial format. This would facilitate further digital processing of the signals. The present invention provides a solution to this problem.

SUMMARY OF THE INVENTION

The present invention resides in a surface acoustic wave (SAW) device that employs acoustic charge transport (ACT) principles to convert multiple parallel input signals into corresponding serial output signals. It has been known for some years that surface acoustic waves can be employed to transport packets of charge across a substrate material at the speed of sound. The principle of operation of ACT devices is analogous to that of charge-coupled devices, except that the ACT device carries charge along with a surface acoustic wave rather than as a result of manipulating externally applied bias signals in a charge-coupled device.

Typically, in an ACT device, electrons are injected through an input diode and are removed through an output diode coupled to the surface of the substrate. In an ACT tapped delay line, packets of electrons are introduced through a single input diode and are detected at multiple, spaced output diodes. In accordance with the invention, a similar structure is employed in an inverse sense. The device of the invention has multiple, spaced input diodes, for injecting multiple packets of electrons corresponding to multiple parallel input signal samples, and these packets are transported across the substrate by surface acoustic waves also input to the substrate. A single output diode removes the electron charge packets from the device in serial fashion. Accordingly, the device operates as a highly efficient parallel-to-serial converter. The electron charge packets may be indicative of binary values, or may employed to carry either digital or analog information.

Briefly, and in general terms, the invention is embodied in a surface acoustic wave (SAW) device for converting parallel information into a serial format, the device comprising a substrate capable of supporting acoustic charge transport (ACT), an input SAW transducer for producing periodic surface acoustic waves, an array of ACT input transducers spaced apart in the direction of propagation of the surface acoustic waves for introducing packets of electrons corresponding to a plurality of input signals, the packets of electrons being transported across the substrate with the surface acoustic waves, and an ACT output transducer for detecting the packets of electrons and producing corresponding electrical signals in a serial format.

In one disclosed embodiment of the invention, the array of ACT input transducers include input diodes for inputting electron charge onto the substrate, and the ACT output transducer includes an output diode for removing charge from the substrate. the SAW input transducer may be a conventional interdigitated transducer fed from an external oscillator. Alternatively, a SAW oscillator may be constructed on the same substrate, including two SAW transducers interconnected by an amplifier.

In another embodiment of the device, instead of a single array of input diodes for input of the electron charge packets, there are two arrays in a parallel arrangement, the diodes of one array being staggered by a uniform amount with respect to the diodes of the other array. Two output diodes are employed to produce serial outputs from the two arrays. This second embodiment gives only partial parallel-to-serial conversion such that the output is two parallel channels, each with half the data rate of the first embodiment.

In one application of the invention, the parallel-to-serial converter is formed on a common substrate with a diffraction-effect device, such as a spectrum analyzer or channelizer. The spectrum analyzer has an array of output transducers providing parallel signals indicative of the spectral content of a signal applied to the inputs of the analyzer. These parallel signals are sampled in a monolithic detector, and applied to a corresponding plurality of ACT input diodes arrayed on the SAW substrate. A SAW oscillator generates surface acoustic waves that pass across the array of input diodes and carry electron charge packets equivalent in magnitude to the outputs from the spectrum analyzer. These charge packets are detected at a single ACT output transducer, which produces a serial-format signal indicative of the output of the spectral analyzer.

It will be appreciated from the foregoing that the present invention represents a significant advance in the field of SAW devices. In particular, the invention provides a novel technique for converting multiple parallel signals to a smaller number of output signals in a serial format. Other aspects and advantages of the invention will become apparent from the following more detailed description of the invention, taken in conjunction with the accompanying drawings.

BRIEF DESCRIPTION OF THE DRAWINGS

FIG. 1 is simplified view of an acoustic parallel-to-serial converter in accordance with the invention;

FIG. 2 is a is a view similar to FIG. 1, but employing a SAW oscillator formed on the same chip as the converter;

DESCRIPTION OF THE PREFERRED EMBODIMENTS

Figure 3:
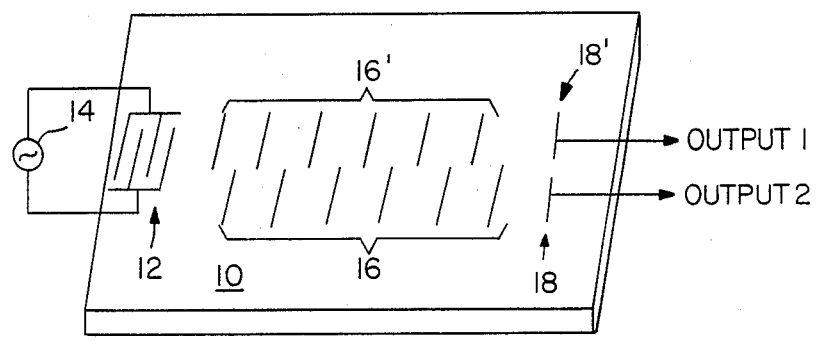
FIG. 3 is a simplified view of an alternated embodiment of the invention, providing two parallel serial-format outputs.

As shown in the drawings for purposes of illustration, the present invention is concerned with techniques for the conversion of multiple parallel signals to a serial format, for use in surface acoustic wave (SAW) devices. There is a general class of SAW devices that produce parallel output data streams, and it is often desirable to convert these to a serial format for more convenient processing.

In accordance with the invention, a known principle of acoustic charge transport is used in an inverse manner to effect a conversion from parallel to serial signal format in a SAW device. It has been known for some years that packets of electric charge can be carried across a substrate by surface acoustic waves. For example, the following papers discuss this concept:

(1) "Charge Transfer by Surface Acoustic Waves on Monolithic MIS Structure," by K. Tsubouchi et al., 1978 IEEE Ultrasonics Symp. Proc., p. 20.

(2) "Charge Transport by Surface Acoustic Waves in GaAs," by M. J. Hoskins et al., Appl. Physics Letters, 41 (4), 15 Aug., 1982.

(3) "Monolithic GaAs Acoustic Charge Transport Devices," by M. J. Hoskins et al., 1982 IEEE Ultrasonics Symp. Proc., p. 456.

The process of acoustic charge transport (ACT) is analogous in some respects to the principles of charge-coupled devices. However, instead of shifting packets of charge by means of switched externally applied bias voltages, in ACT devices the charge packets can be considered to be carried across a substrate in the troughs of surface acoustic waves.

The principle of the invention is illustrated in FIG. 1, which includes a substrate, indicated by reference numeral 10, a SAW input transducer 12 coupled to an external oscillator 14, an input tap array 16, and an output transducer 18. The SAW input transducer 12 generates surface acoustic waves at a selected frequency, and these are propagated across the substrate 10 and through the input tap array 16. Input signals are applied to the input array 16 in a manner known in the art of ACT devices. Basically, this involves coupling input signals to the array through input diodes. As will be discussed with reference to FIG. 5, parallel input signals are sampled in some manner, and packets of electrons corresponding to the sampled signals are periodically injected onto the substrate through the input array 16. The packets of electrons are immediately transported away from the input tap array 16 by the surface acoustic waves propagating across the substrate 10. The output transducer 18, which includes an output diode, detects the amount of electron charge in each SAW trough reaching it, and converts the packets of electron charge back into an electrical signal, having a serial format instead of a parallel one.

The device shown in FIG. 2 is similar to that of FIG. 1 except that it includes an on-chip oscillator, comprising two SAW transducers 12', interconnected by an amplifier 20. Operation of the device is identical. Surface acoustic waves from the transducers 12' are used to transport packets of electron charge from the input array 16 to the output transducer 18, converting the signals from a parallel to a serial format.

The embodiment shown in FIG. 3 is similar to that of FIG. 1, except that there are two input arrays 16 and 16' and two output transducers 18 and 18'. The individual input transducers of array 16' are arranged in a parallel relationship with those of array 16, and are displaced longitudinally as well, providing "odd" and "even" input taps. The arrangement produces two serial-format output streams from the output transducers 18 and 18', and permits the use of lower-rate serial output streams for those applications that require it. The concept may be expanded as desired to provide any number serial output data streams.

Figure 4:
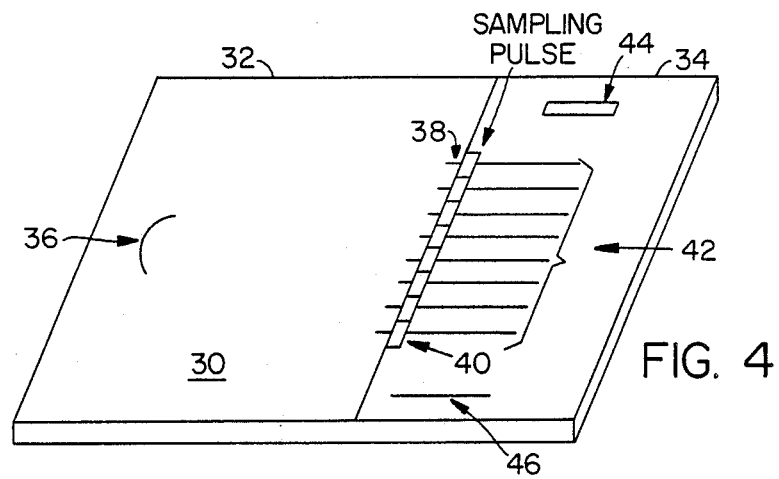
FIG. 4 is a simplified view of a monolithic channelizer and parallel-to-serial converter in accordance with the invention.

FIG. 4 illustrates a monolithic channelizer and parallel-to-serial signal processor, including a single piezoelectric substrate 30 on which is formed a channelizer or spectrum analyzer 32 and a parallel-to-serial converter 34. The channelizer 32 has an input focusing transducer 36 and an array of output transducers 38. The channelizer 32 is a diffraction-effect device that converts a broadband input signal into a plurality of output signals indicative of the spectral content of the input signal. Such devices are described, for example, in U.S. Pat. No. 4,499,393, entitled "Surface Acoustic Wave Spectrum Analyzer," issued to Yen et al., and in U.S. patent application Ser. No. 529,066, filed Sept. 2, 1983 by Brooks, and entitled "Signal Processing System and Method."

Each output transducer 38 is coupled directly to a separate monolithic detector 40, which is, in turn, coupled to one element of an input array 42 of the parallel-to-serial converter 34. The converter 34 also includes an integral SAW oscillator 44 disposed in line with and to one side of the input array 42, and a serial output collector diode 46 disposed on the other side of the input array. As in the previously described embodiments, surface acoustic waves are generated by the SAW oscillator 44 and are employed to carry charge injected in a parallel fashion at the input array 42. The resulting charge packets are converted back into a serial electrical signal at the serial output collector 46.

Figure 5:
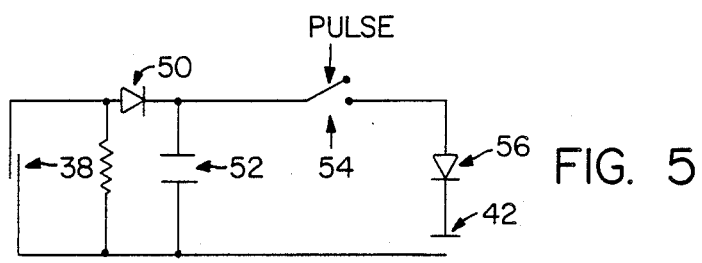
FIG. 5 is a simplified schematic diagram showing how an output signal from the channelizer of FIG. 4 is coupled to the parallel-serial-converter.

The action of the monolithic detector 40 is illustrated in the schematic diagram of FIG. 5. Each segment of the detector includes a first diode 50 and a capacitor 52. An output transducer 38 is connected through the first diode 50 to the capacitor 52, which accumulates a charge proportional to the electrical signal received at the output transducer. The capacitor 52 is coupled to a corresponding element of the input array 42, through a switch 54 and a second diode 56. When a sampling pulse is applied to the switch 54, the switch is closed momentarily and the charge stored in the capacitor 52 is coupled through the second diode 56 to the corresponding element of the input array 42. Similar circuitry is employed at each element of the detector 40, and the sampling pulse is applied to all of the elements of the detector at the same time. In this manner, the signals received at the output transducers 38 are sampled periodically, and injected as parallel charge packets into the input array 42 of the parallel-to-serial converter 34.

It will be appreciated from the foregoing that the present invention represents a significant advance in the field of surface acoustic wave devices. In particular, the invention provides a useful parallel-to-serial signal processor, which may also be used in combination with a SAW channelizer to yield a serial output from spectrum analysis. It will also be appreciated that, although specific embodiments of the invention have been described in detail for purposes of illustration, various modifications may be made without departing from the spirit and scope of the invention. Accordingly, the invention is not to be limited except as by the appended claims.

We claim:

1. A monolithic surface acoustic wave (SAW) signal processing device, comprising:

a piezoelectric substrate;

a SAW channelizer formed on the substrate and having a focusing SAW input transducer for inputting a broadband electrical input signal and producing acoustic signals that are angularly dispersed in accordance with frequency, and having multiple output signals indicative of the spectral content of the input signal; and SAW means for parallel-to-serial conversion, formed on the same substrate as the SAW channelizer, for converting the parallel electrical output signals.

2. A monolithic SAW signal processing device as defined in claim 1, in which the SAW means for parallel-to-serial conversion includes:

a source of surface periodic acoustic waves propagated across the substrate;

an array of acoustic charge transport (ACT) input transducers disposed in the path of the surface acoustic waves;

signal coupling means for converting each channelizer output signal into an electric charge packet for input to one of the ACT input transducers, after which the charge packets are transported across the substrate; and an ACT output transducer disposed in the path of the surface acoustic waves, to convert the transported charge packets into a serial output signal.

3. A surface acoustic wave (SAW) device for converting parallel information into a serial format, the device comprising:

a substrate capable of supporting acoustic charge transport (ACT);

an input SAW transducer, for producing periodic surface acoustic waves;

an array of ACT input transducers spaced apart in the direction of propagation of the surface acoustic waves, for introducing packets of electrons corresponding to a plurality of input signals, the packets of electrons being transported across the substrate with the surface acoustic waves;

an ACT output transducer, for detecting the packets of electrons and producing corresponding electrical signals in a serial format;

a SAW channelizer device producing multiple parallel output signals indicative of the spectral content of a broadband input signal; and a detector array for connecting output signals from the SAW channelizer to corresponding elements of the array of ACT input transducers, whereby the parallel outputs of the SAW channelizer are converted to serial output signals.

* * * * *